United States Patent [19]

Maudie et al.

[11] Patent Number: 5,646,072
[45] Date of Patent: Jul. 8, 1997

[54] ELECTRONIC SENSOR ASSEMBLY HAVING METAL INTERCONNECTIONS ISOLATED FROM ADVERSE MEDIA

[75] Inventors: Theresa Maudie, Phoenix; David J. Monk, Mesa, both of Ariz.

[73] Assignee: Motorola, Inc., Schaumburg, Ill.

[21] Appl. No.: 415,287

[22] Filed: Apr. 3, 1995

[51] Int. Cl.[6] .................................................. H01L 21/00
[52] U.S. Cl. ........................ 437/228; 437/901; 156/629.1; 156/657.1
[58] Field of Search .................. 156/629.1, 633.1, 156/655.1, 659.1; 437/901, 228, 921

[56] References Cited

U.S. PATENT DOCUMENTS

| | | | |
|---|---|---|---|
| 4,773,972 | 9/1988 | Mikkor | 437/921 X |
| 5,061,987 | 10/1991 | Hsia | 257/702 |
| 5,101,665 | 4/1992 | Mizuno | 73/721 |
| 5,145,810 | 9/1992 | Matsumi | 437/228 |
| 5,209,122 | 5/1993 | Matly et al. | 73/727 |
| 5,320,705 | 6/1994 | Fujii et al. | 437/921 X |

FOREIGN PATENT DOCUMENTS 72775  4/1984  Japan .

OTHER PUBLICATIONS

"Fabrication Technology for Wafer–Through Hole Interconnections and Three–Dimensional Stacks of Chips and Wafers," Linder et al., Proceedings, IEEE, Micro Electro Mechanical Systems, IEEE Robotics and Automation Society, Oiso, Japan, Jan. 25–28, pp. 349–354.

"A pH–ISFET and an Integrated pH–Pressure Sensor with Back–side Contacts," Van Den Vlekkert et al., Sensors and Actuators, 14, (1988), pp. 165–176.

Primary Examiner—Thi Dang
Attorney, Agent, or Firm—Bruce T. Neel

[57] ABSTRACT

A pressure sensor (32) having a transducer (34) disposed on a top surface of an active die (38). The transducer has a doped region (42), the active die is disposed on a mounting substrate (70), and an interconnect opening (48) is disposed at an edge (90) of the active die. A metal layer (50) is disposed in the interconnect opening and on the top surface of the active die to be in electrical contact with the doped region. A conductive bump (76) is disposed on the mounting substrate in electrical contact with the metal layer and a conductive trace (74) on the mounting substrate.

14 Claims, 4 Drawing Sheets

ELECTRONIC SENSOR ASSEMBLY HAVING METAL INTERCONNECTIONS ISOLATED FROM ADVERSE MEDIA

BACKGROUND OF THE INVENTION

The present invention relates, in general, to electronic sensors and, more particularly, to sensing transducers in which the metal interconnections between the transducer and external control circuitry are isolated from any harsh media to be sensed by the transducer.

A common type of electronic sensing transducer is a pressure sensor. As pressure sensors become more widespread in use, there is a need for sensing the pressure of an increasing variety of media. Such media include what are known as "harsh" media, which typically degrade certain components of the sensor that come in contact with the harsh media. Some examples of harsh media include polar and non-polar solvents, salt water, acids, and bases.

A significant problem in sensing the pressure of a harsh media is that the media itself can adversely affect certain components of the pressure sensor or its package. For example, some organic media can cause swelling or dissolution of plastic components, while some ionic media can permeate through portions of a sensor package and corrode metal components therein or etch exposed silicon surfaces. Accordingly, there is a need for a pressure sensor package that is more resistant to the adverse effects of harsh media, such as swelling or dissolution by organic solvents, metallic corrosion by ionic solutions, or etching of exposed silicon surfaces by alkaline ionic solutions.

DETAILED DESCRIPTION OF THE DRAWINGS

Figure 1:
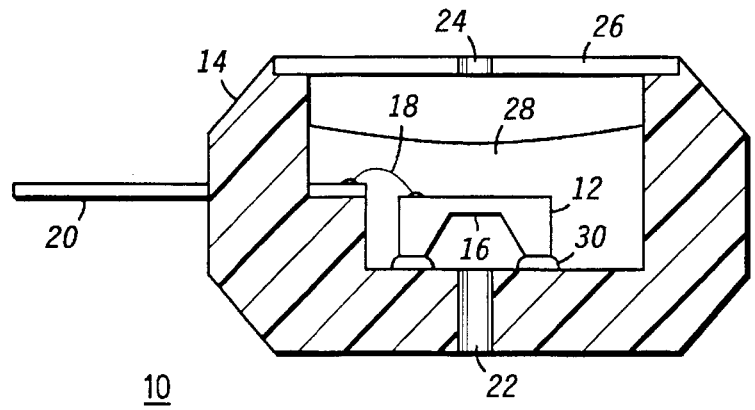
FIG. 1 is a cross-sectional view of a prior pressure sensor assembly.

FIG. 1 illustrates a cross-sectional view of a prior pressure sensor assembly 10 having an active die 12 disposed in a package 14. Active die 12 has a pressure sensing transducer (not shown) disposed on a thin diaphragm 16, and wire bonds 18 electrically connect active die 12 to a lead-frame 20. Thin diaphragm 16 flexes in response to differential pressure through a port 22 and a port 24, which is disposed in a cap 26. A silicone gel 28 surrounds active die 12 and wire bonds 18, and active die 12 is attached to package 14 using a polymer 30.

A problem with pressure sensor assembly 10 is that it is generally not suited for sensing the pressure of harsh media. Specifically, because silicone gel 28 has a typical permeability in water of about $1 \times 10^{-8}$ g/cm-sec-torr, any ionic species in contact with gel 28 tends to permeate through gel 28 and corrode wire bonds 18 and also the connections between wire bonds 18 and both active die 12 and lead-frame 20. Silicone gel 28 is also permeable to organic solvents such as toluene and ethanol. These organic solvents tend to cause swelling of silicone gel 28 resulting in a distortion of the sensing characteristics of active die 12 and an increase in susceptibility to future corrosion.

Another disadvantage of sensor assembly 10 is that it uses wire bonds 18. The integrity of the connection between wire bonds 18 and bonding pads (not shown) on active die 12 is a significant reliability problem because of the difficulty of wire-bonding a die on an elastomeric die attach material. Thus, it is desirable to provide a sensor assembly that does not require wire bonds 18.

Briefly stated, the above problems and others are solved by the present invention which provides an electronic sensor assembly including a sensing element disposed on an active die, an interconnect opening disposed at an edge of the active die, and a metal layer disposed in the interconnect opening and electrically coupled to the sensing element. In a preferred embodiment, a conductive bump electrically connects the portion of the metal layer disposed in the interconnect opening to a conductive trace that is disposed on a mounting substrate, which supports the active die. By placing the metal layer at the edge of the active die, harsh media being sensed by the sensing element can be isolated from the metal layer.

Figure 2:
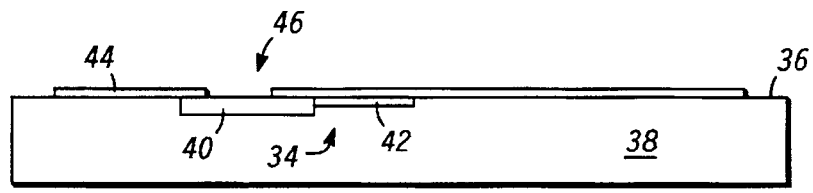
FIGS. 2–5 are cross-sectional views illustrating sequential steps in the manufacture of a sensor assembly according to the present invention.

The present invention can be more fully described with reference to FIGS. 2–11. Specifically, FIGS. 2–5 are cross-sectional views illustrating sequential steps in the manufacture of a sensor assembly 32 (see FIG. 5). Referring to FIG. 2, a sensing element 34 has been formed on a top surface 36 of an active die 38. In this particular embodiment, sensing element 34 comprises a heavily-doped region 40 disposed in contact with a lightly-doped region 42. Doped regions 40 and 42 are, for example, doped with a P-type dopant. Regions 40 and 42 may be formed by standard ion implantation, and active die 38 may be silicon. Also, an oxide layer 44 has been formed on top surface 36 to provide an opening 46, as is known. In this specific embodiment, sensing element 34 is a piezoresistive pressure transducer, but one of skill in the art will recognize that other types of transducers may be used in other applications.

Figure 3:
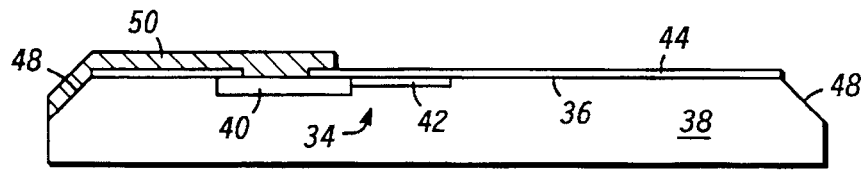

In FIG. 3, according to the present invention, first interconnect openings 48 have been formed, for example, by an anisotropic wet etch using, for example, potassium hydroxide as is known. Further details regarding the formation of openings 48 are discussed below with reference to FIGS. 6 and 7. Next, a metal layer 50 is, for example, sputtered onto active die 38 and then patterned to contact doped region 40 through opening 46 (see FIG. 2) and to extend down into first interconnect opening 48. For example, metal layer 50 may be an aluminum layer, with or without a barrier metal, having a thickness of about 11,000 angstroms. Metal layer 50 is used to electrically connect sensing element 34 to external circuitry (not shown), as will be discussed further below. Although not shown in FIG. 3, it is preferred that a passivation layer, such as silicon nitride, be formed over metal layer 50 and oxide layer 44.

Figure 4:
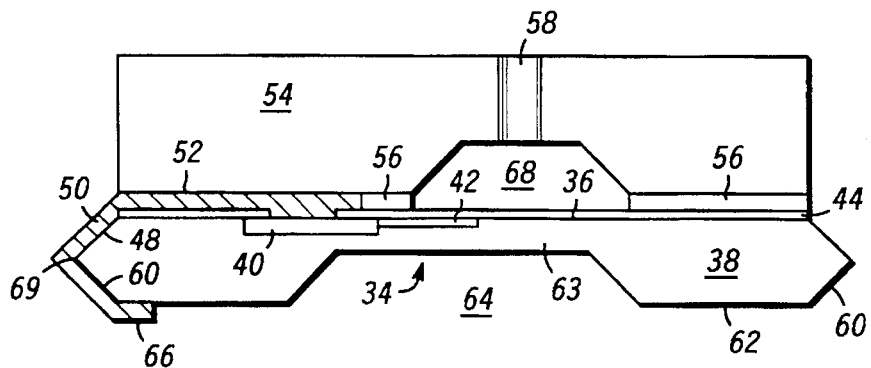

Referring to FIG. 4, a bottom surface 52 of a constraint die 54, for example silicon, is attached to active die 38 using a glass frit 56, as is known. Glass frit 56 should have a permeability sufficiently low so that any harsh media present in cavity 68 does not permeate to metal layer 50. Constraint die 54 optionally has a sensing port 58 if sensing element 34 is to be used for differential pressure sensing.

Second interconnect openings 60 are formed, for example, by an anisotropic wet etch of a bottom surface 62 of active die 38, as is known. This etch is isolated to the back-side of a wafer that includes active die 38. Openings 60 are aligned underneath openings 48 as discussed more below. Also, because in this embodiment sensing element 34 is a pressure transducer, it is also preferred that a thin diaphragm be formed by etching a cavity 64 in this same wet etching step, as is also known. A bottom portion 66 of metal layer 50 is formed by, for example, metal sputtering directed towards bottom surface 62. After this sputtering, metal layer 50 is substantially continuous from top surface 36 around an edge 68 of first interconnect opening 48 to bottom surface 62. Prior to attaching constraint die 54 to active die 38, if desired, a cavity 68 may be formed in constraint die 54 using standard anisotropic wet etching techniques. Cavity 68 is preferred, for example, if port 58 is to be provided for differential pressure sensing.

Constraint die 54 is preferably formed from a material having a permeability less than about $1 \times 10^{-12}$ g/cm-sec-torr. Suitable materials for constraint die 54 include silicon and glass. Also, active die 38 is preferably formed from a material having a permeability less than about $1 \times 10^{-12}$ g/cm-sec-torr, such as silicon.

Figure 5:
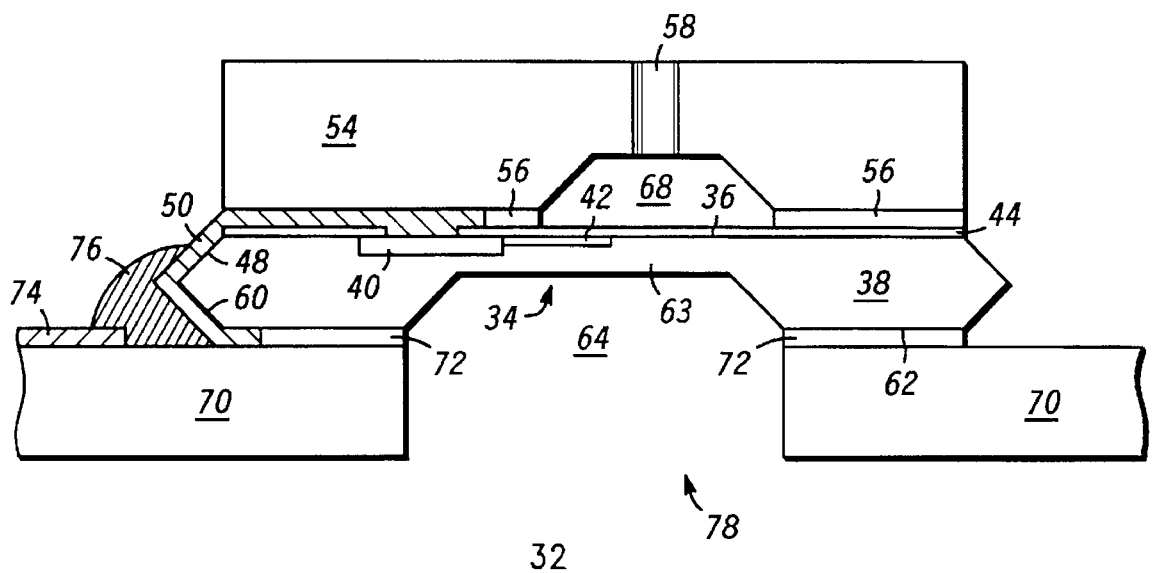
Figure 7:
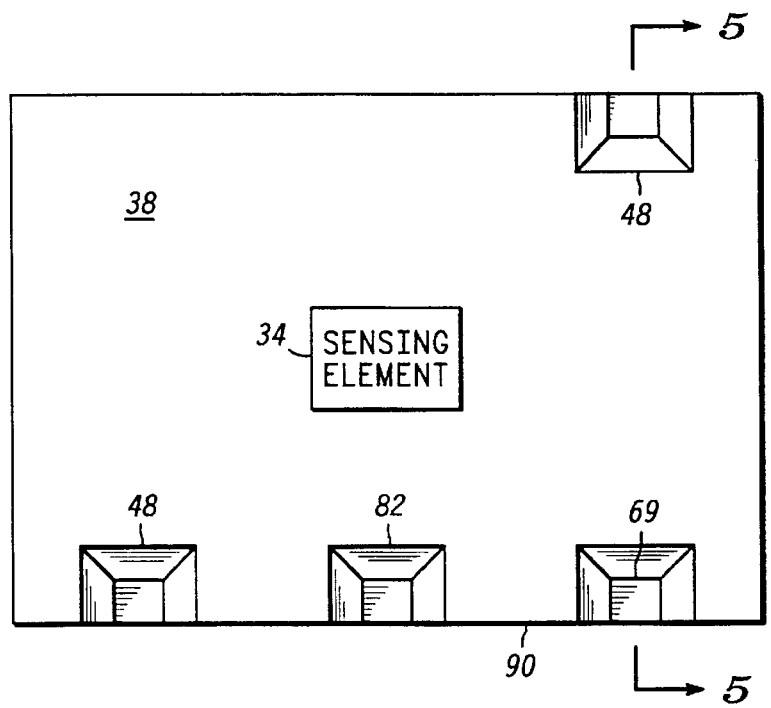

A cross-section of active die 38, taken as shown in FIG. 7, is illustrated in FIG. 5. Now referring to FIG. 5, bottom surface 62 of active die 38 is attached to a mounting substrate 70 using, for example, an epoxy layer 72. Alternatively, a glass frit or eutectic bonding can be used in place of epoxy layer 72. It should be noted that epoxy layer 72, or a suitable alternative, should have a permeability sufficiently low to avoid diffusion of any harsh media present in cavity 64 to metal layer 50. Mounting substrate 70 is typically a printed-wire board or a ceramic/glass substrate, and a conductive trace 74 is disposed thereon. Mounting substrate 70 could alternatively be another constraint wafer.

According to the present invention, a conductive bump 76 is disposed on mounting substrate 70 to be in electrical contact with both metal layer 50 and conductive trace 74. Conductive bump 76 is, for example, a solder bump or a conductive epoxy bump. In some cases, conductive bump 76 can be over-coated with an encapsulant. In other embodiments, one of skill in the art will recognize that conductive bump 76 may be replaced by a wire bond (not shown) that is directly connected to metal layer 50.

Sensor assembly 32 is typically mounted in a plastic package (not shown) that is attached to constraint die 54 or mounting substrate 70 using an adhesive. As one of skill in the art will recognize, the plastic package helps contain any harsh media within cavity 68 or cavity 64, and thus isolates conductive bump 76 and metal layer 50 from any harsh media that may be present in cavity 68 or cavity 64. A hole 78 is provided in mounting substrate 70 and epoxy layer 72 so that cavity 64 is accessible to the media to be sensed.

Although FIGS. 2–5 illustrate only a single active die, it is preferred that first interconnect openings 48, second interconnect openings 60, and metal layer 50 be formed while active die 38 is still adjoined to a plurality of other active dies on a first semiconductor wafer. Similarly, it is preferred that cavity 68 of constraint die 54 be formed prior to separating die 54 from a plurality of other adjoining die on a second semiconductor wafer used to form constraint die 54.

Figure 6:
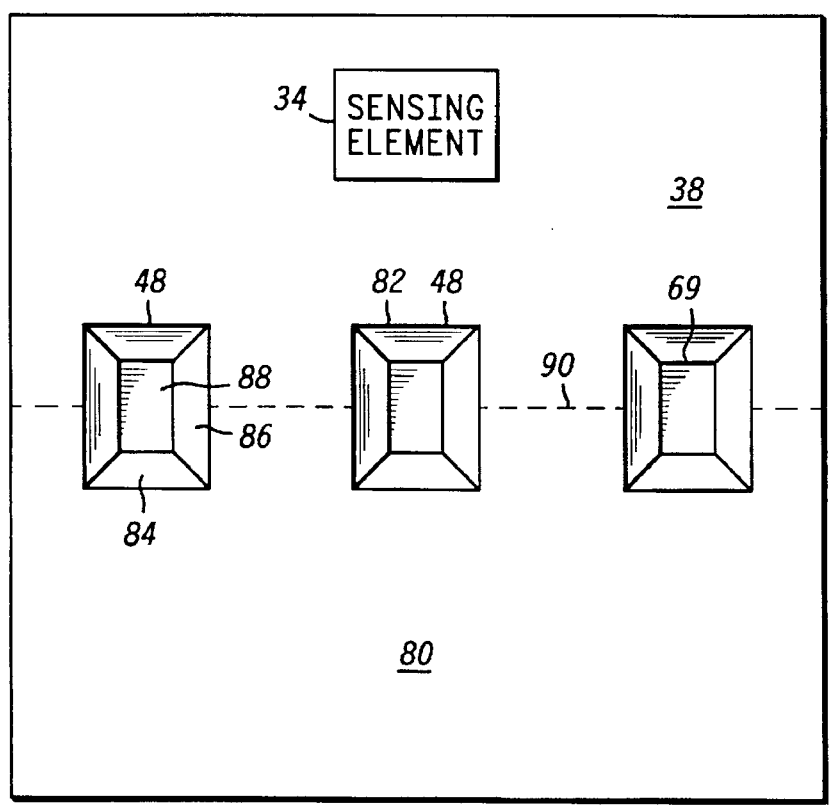
FIGS. 6 and 7 are simplified plan views illustrating steps in the manufacture of the sensor assembly of FIG. 5.

FIG. 6 is a top view of active die 38 and an adjoining active die 80 as found on a semiconductor wafer, which typically contains hundreds of such die prior to their separation. In the preferred embodiment, first interconnect openings 48 are formed so that an outer perimeter 82 thereof straddles a boundary 90 between active die 38 and active die 80. Boundary 90 indicates the line of separation that will be used to separate dies 38 and 80, for example, prior to attaching active die 38 to mounting substrate 70. Preferably, constraint die 54 and active die 38 are attached together prior to separating dies 38 and 54 from their respective wafers.

If it is desired that interconnect openings 48 have sloped walls, then an anisotropic wet etch is preferred. Such an etch will provide sloping planes 84 and 86 which have a (111) crystal orientation and a plane 88 which has a (100) crystal orientation. Interconnect openings 48 are etched to a depth that varies depending on the particular configuration desired for interconnect openings 48, as will be discussed further below. Such anisotropic etching is further described in "Fabrication Technology for Wafer-Through Hole Interconnections and Three-Dimensional Stacks of Chips and Wafers," Linder et al., Proceedings, IEEE, Micro Electro Mechanical Systems, IEEE Robotics and Automation Society, Oiso, Japan, Jan. 25–28, 1994, pp. 349–354, which is hereby incorporated by reference in full.

Although not shown in FIG. 6, it should be noted that second interconnect openings 60, when used, are formed on bottom surface 62 of active die 38 (see FIG. 5) to be substantially aligned and co-extensive with interconnect openings 48 so that an opening is formed completely through active dies 38 and 80 within the confines of outer perimeter 82.

FIG. 7 is a top view of active die 38 after it has been separated from active die 80 along boundary 90, for example, by wafer sawing. After this separation, boundary 90 is now edge 90 of active die 38.

Metal layer 50 is not shown in FIGS. 6 or 7 for simplicity, but in an actual device metal layer 50 provides an electrical connection from sensing element 34 to interconnect openings 48. Metal layer 50 is disposed in interconnect openings 48 and is preferably patterned to extend outside of outer perimeter 82. Metal layer 50 is preferably formed and patterned prior to the separation of active die 38 from active die 80. Metal layer 50 may be patterned using photolithography, and it is preferred that a positive photoresist be used. Otherwise, it can be difficult to focus an exposure light source onto sloped planes 84 or 86 of interconnect openings 48.

Figure 8:
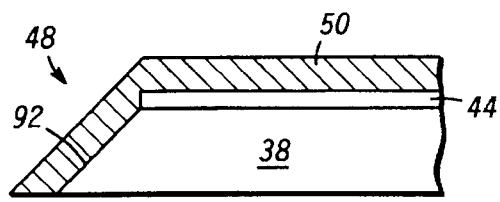
FIGS. 8–10 are cross-sectional views of interconnect openings according to three embodiments of the present invention.
Figure 9:
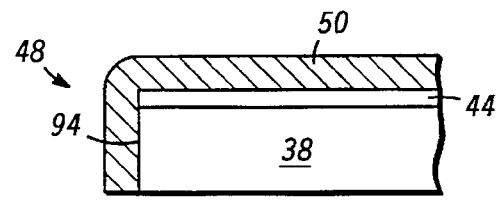
Figure 10:
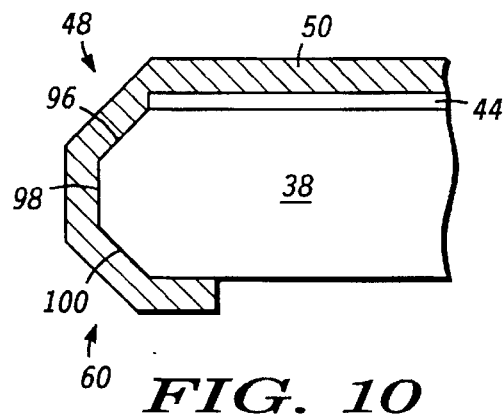

As discussed above, interconnect openings 48 and 60 are formed to allow an electrical connection by external circuits to metal layer 50 near edge 90 of active die 38. FIGS. 8–10 illustrate alternative embodiments for these openings. Specifically, FIG. 8 illustrates interconnect opening 48 as having a single downward-sloping surface 92 as obtained with an anisotropic wet etch, as described above. It should also be noted that underlying interconnect opening 60 is not provided in this embodiment, and instead active die 38 could also be thinned on its bottom side as is known.

Another embodiment is shown in FIG. 9 in which interconnect opening 48 has a substantially vertical wall 94, which is formed by known plasma etching methods. This plasma etching may be performed either from a single side of active die 38 or from both sides thereof. It will be appreciated by one of skill in the art that wall 94 will have an angle of, for example, about 82–85 degrees from the horizontal following plasma etching (this slight slope is not shown in FIG. 9, which is simplified for illustration). Anisotropic wet etching is not used in this embodiment.

Referring to FIG. 10, first interconnect opening 48 is formed with a sloped surface 96 using an anisotropic wet etch, a substantially vertical surface 98 is formed by a plasma etch following this wet etch, and a sloped surface 100 is formed by a second anisotropic wet etch to provide interconnect opening 60.

Figure 11:
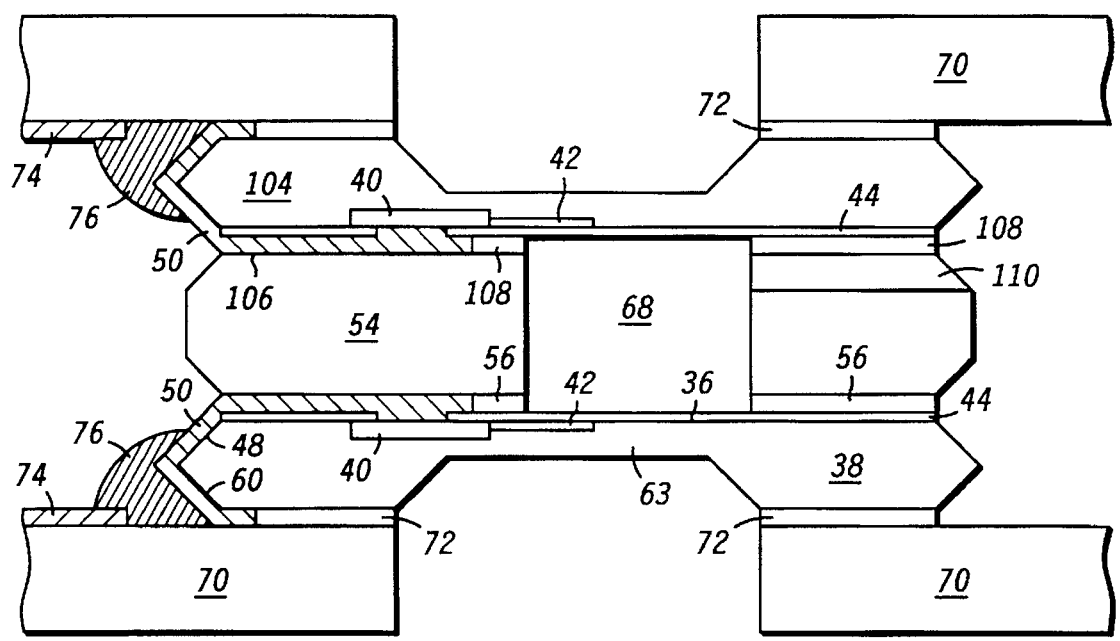
FIG. 11 is a cross-sectional view of a sensor assembly having two active dies according to the present invention.

FIG. 11 is a cross-sectional view of a sensor assembly 102 according to a second embodiment of the present invention. Specifically, an active die 104 is attached to a top surface 106 of constraint die 54 using, for example, a glass frit 108 to provide cavity 68. Sensor assembly 102 generally has a symmetrical structure with each of its halves substantially resembling sensor assembly 32 as shown in FIG. 5. If it is desired to use cavity 68 for differential pressure sensing, a trench 110 may be formed in constraint die 54 prior to attaching active die 104. Sensor assembly 102 is manufactured substantially as described above for sensor assembly 32, and common reference numbers are used for substantially similar elements.

By now, it should be appreciated that there has been provided a novel sensor assembly and method that permits the sensing of a harsh media without exposing any metal interconnects to this media and that provides improved sensitivity over a broader temperature range. This avoids the metallic corrosion observed in prior harsh media sensors and eliminates the need for a silicone gel. Moreover, the use of a metal interconnect layer at an edge of the active die along with a conductive bump eliminates the need for internal wire bonding, which is known to create reliability problems. Also, the sensor assembly according to the present invention permits the formation of dual sensor assemblies having two active dies.

The foregoing discussion discloses and describes merely exemplary methods and embodiments of the present invention. As will be understood by those familiar with the art, the invention may be embodied in other specific forms without departing from the spirit or essential characteristics thereof. For example, although the specific embodiment described above uses a pressure sensor, other embodiments may use chemical or other types of sensing transducers. Accordingly, the disclosure of the present invention is intended to be illustrative, but not limiting, of the scope of the invention, which is set forth in the following claims.

We claim:

1. A method of forming a sensor assembly, comprising the steps of:

forming a sensing element on a top surface of a first active die;

etching said top surface to form a first interconnect opening at an edge of said first active die;

forming a metal layer on at least said top surface so that said metal layer is in contact with said sensing element, and a first portion of said metal layer is disposed in said first interconnect opening;

attaching a bottom surface of said first active die to a mounting substrate; and disposing a conductive bump in electrical contact with said metal layer.

2. The method of claim 1 wherein said conductive bump is also in electrical contact with a conductive trace on said mounting substrate.

3. The method of claim 1 further comprising the step of etching a bottom surface of said first active die to form a second interconnect opening disposed underneath and connected to said first interconnect opening.

4. The method of claim 3 wherein a second portion of said metal layer is disposed in said second interconnect opening.

5. The method of claim 1 wherein said sensing element is a pressure transducer and further comprising the step of forming a cavity underneath said sensing element so that a thin diaphragm is provided for sensing a pressure.

6. The method of claim 1 wherein said step of etching said top surface comprises anisotropic wet etching.

7. The method of claim 6 wherein said first active die is disposed as one of a plurality of dies on a semiconductor wafer during said step of etching said top surface.

8. The method of claim 1 wherein said step of etching said top surface comprises anisotropic wet etching followed by plasma etching.

9. The method of claim 1 wherein said step of etching said top surface comprises plasma etching.

10. The method of claim 1 wherein a second active die adjoins said first active die during said step of etching and said first interconnect opening straddles a boundary between said first active die and said second active die.

11. The method of claim 10 further comprising the step of separating said first active die and said second active die along said boundary following said step of forming a metal layer.

12. The method of claim 1 further comprising the step of attaching a bottom surface of a constraint die to a top surface of said first active die.

13. The method of claim 12 further comprising the step of attaching a second active die to a top surface of said constraint die.

14. The method of claim 12 wherein said constraint die is silicon.

* * * * *

UNITED STATES PATENT AND TRADEMARK OFFICE
CERTIFICATE OF CORRECTION

PATENT NO. : 5,646,072
DATED : Jul. 8, 1997
INVENTOR(S) : Maudie et al.

It is certified that error appears in the above-identified patent and that said Letters Patent is hereby corrected as shown below:

col. 3, line 6, after " thin diaphragm" insert -- 63 --.

col. 3, line 11, delete "68" and insert -- 69 --.

Signed and Sealed this

Twenty-sixth Day of January, 1999

Attest:

Attesting Officer

*Acting Commissioner of Patents and Trademarks*